United States Patent
Chen et al.

(10) Patent No.: US 10,852,379 B2
(45) Date of Patent: Dec. 1, 2020

(54) ARTIFACT REDUCTION BY IMAGE-TO-IMAGE NETWORK IN MAGNETIC RESONANCE IMAGING

(71) Applicant: Siemens Healthcare GmbH, Erlangen (DE)

(72) Inventors: Xiao Chen, Princeton, NJ (US); Boris Mailhe, Plainsboro, NJ (US); Benjamin L. Odry, West New York, NJ (US); Pascal Ceccaldi, Princeton, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 293 days.

(21) Appl. No.: 16/002,447

(22) Filed: Jun. 7, 2018

(65) Prior Publication Data

US 2019/0377047 A1 Dec. 12, 2019

(51) Int. Cl.

| G01R 33/56 | (2006.01) |
|---|---|
| G06T 5/00 | (2006.01) |
| G01R 33/565 | (2006.01) |
| G06T 11/00 | (2006.01) |
| G01R 33/48 | (2006.01) |

(52) U.S. Cl.
CPC ..... *G01R 33/5608* (2013.01); *G01R 33/4818* (2013.01); *G01R 33/56509* (2013.01); *G06T 11/008* (2013.01); *G06T 2210/41* (2013.01)

(58) Field of Classification Search
USPC .................................................. 382/128, 275
See application file for complete search history.

(56) References Cited

U.S. PATENT DOCUMENTS

| 9,569,843 B1* | 2/2017 | Mailhe | G06T 5/10 |
|---|---|---|---|
| 10,387,765 B2* | 8/2019 | Mailhe | G06N 3/084 |
| 10,698,063 B2* | 6/2020 | Braun | G06N 3/0454 |
| 2017/0372193 A1* | 12/2017 | Mailhe | G06N 3/0472 |
| 2019/0104940 A1* | 4/2019 | Zhou | G06T 11/008 |

OTHER PUBLICATIONS

Duffy, Ben et al., Retrospective correction of motion artifact affected structural MRI images using deep learning of simulated motion, 1st Conference on Medical Imaging with Deep Learning (MIDL 2018), Amsterdam, The Netherlands; 8 pages.

Loktyushin, Alexander, Learning-based solution to phase error correction in T2*-weighted GRE scans, 1st Conference on Medical Imaging with Deep Learning (MIDL 2018), Amsterdam, The Netherlands; 3 pages.

* cited by examiner

*Primary Examiner* — Ishrat I Sherali

(57) ABSTRACT

For artifact reduction in a magnetic resonance imaging system, deep learning trains an image-to-image neural network to generate an image with reduced artifact from input, artifacted MR data. For application, the image-to-image network may be applied in real time with a lower computational burden than typical post-processing methods. To handle a range of different imaging situations, the image-to-image network may (a) use an auxiliary map as an input with the MR data from the patient, (b) use sequence metadata as a controller of the encoder of the image-to-image network, and/or (c) be trained to generate contrast invariant features in the encoder using a discriminator that receives encoder features.

16 Claims, 4 Drawing Sheets

ARTIFACT REDUCTION BY IMAGE-TO-IMAGE NETWORK IN MAGNETIC RESONANCE IMAGING

BACKGROUND

The present embodiments relate to magnetic resonance (MR) imaging. The sources and appearances of artifacts in MR images are numerous. Motion artifact, caused by patient motion or physiological dynamics, is one common type of MR artifact. Motion artifact may lead to blurring and ghosting in the image. Off-resonance, depending on the pulse sequence, may cause signal loss, ghosting, blurring, and distortion in the image. The effect of off-resonance usually become stronger on high-field (e.g., greater the 3 Tesla) MR scanners and in fast imaging with prolonged readout. Trajectory infidelity, where the real-acquired k-space trajectory deviates from design due to eddy-current, may lead to shearing, shading, blurring in the images, such as DWI and MR spectroscopy images.

Many MR artifact removal or reduction techniques have been proposed and developed. Retrospective methods usually require special hardware or prolonged acquisition for additional data. Image post-processing methods are based on some model, either a signal model or physical model. As a result, the image post-processing method usually has limited performance where the underlying model cannot fully describe the real situation. A complex model that tries to encapsulate more effects demands large computation power, which limits its clinical application.

SUMMARY

Systems, methods, and instructions on computer readable media are provided for artifact reduction in a magnetic resonance imaging system. Deep learning trains an image-to-image neural network to generate an image with reduced artifact from input, artifacted MR data. For application, the image-to-image network may be applied in real time with a lower computational burden than typical post-processing methods. To handle a range of different imaging situations, the image-to-image network may (a) use an auxiliary map as an input with the MR data from the patient, (b) use sequence metadata as a controller of the encoder of the image-to-image network, and/or (c) be trained to generate contrast invariant features in the encoder using a discriminator that receives encoder features.

In a first aspect, a method is provided for artifact reduction in a magnetic resonance imaging system. The magnetic resonance imaging system scans a patient. The scanning provides at least first and second sets of magnetic resonance data. The first and second sets represent response to the scanning from first and second distributions of locations. The first and second sets of the magnetic resonance data are input to a neural network machine trained as an image-to-image network. The neural network generates an image in response to the inputting of the first and second sets. The image is displayed.

In a second aspect, a method is provided for artifact reduction in a magnetic resonance imaging system. The magnetic resonance imaging system scans the patient. The scanning provides a set of magnetic resonance data based on a scan sequence. The set of the magnetic resonance data in input to a neural network machine trained as an image-to-image network. Information about the scan sequence is input to an encoder or decoder of the image-to-image network. The neural network generates an image of the patient in response to the inputting of the set and the information. The image is displayed.

In a third aspect, a method of training a neural network is provided for artifact reduction in a magnetic resonance imaging system. Sets of magnetic resonance data and ground truth images are obtained. An image-to-image network is defined as having an encoder and a discriminator connected with the encoder. The discriminator is configured to discriminate between scan sequences. The image-to-image network is machine trained to generate a patient image from the sets and the ground truth images. The training uses the discriminator. The trained image-to-image network is stored.

Any one or more of the aspects described above may be used alone or in combination. These and other aspects, features and advantages will become apparent from the following detailed description of preferred embodiments, which is to be read in connection with the accompanying drawings. The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

DETAILED DESCRIPTION OF EMBODIMENTS

Artificial intelligence (AI) provides image-to-image generation for artifact reduction. MR artifacts are reduced (e.g., removed) using an image-to-image network trained by deep learning. Deep-learning methods are used to learn from pairs of artifact-free images and artifacted data (k-space and/or images). The network takes pairwise artifact-free images and artifact-contaminated data and learns to minimize the difference between estimated artifact-free images (output of the network) and the targeted artifact-free images (e.g., directly from k-space data). An adversarial network may be used to further refine the predicted images (i.e., refine the image-to-image network to produce more accurate, artifact reduced images). In an application stage, MR data with artifacts is fed to the learned network(s) to generate the desired clean images. The learning-based methods are not designed from any knowledge of artifacts sources and MR physics. In combination with use of a machine-learned neural network, an artifact-reduced image may be generated in a computationally efficient manner as compared to complex modeling.

The image-to-image network may be trained to operate given any of a range of different imaging situations and corresponding scan sequences despite differences in resulting artifacts. Training data appropriate for the range of situations and/or artifacts are obtained. Auxiliary information, such as sequence type (GRE, balanced SSFP, etc.) and sequence protocol (TR, TE, TI, etc.), may be used to control the encoder of the image-to-image network. Auxiliary data, such as pre-scan data that is included in routine imaging protocol, may be input to the network with the artifacted MR data from scanning the patient. The network may be trained to be less contrast variant by training with a discriminator receiving features from the encoder.

These approaches may be used for reducing motion artifact in the generated image. Other MR artifacts, such as artifacts from off-resonance and trajectory infidelity, may be reduced in the generated image.

Figure 1:
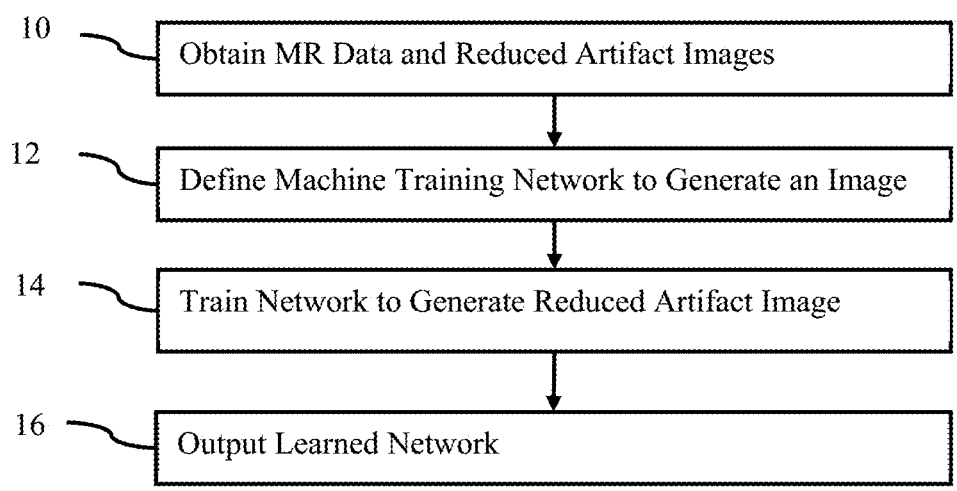
FIG. 1 illustrates one embodiment of machine training an image-to-image network for artifact reduction in MR imaging.
Figure 6:
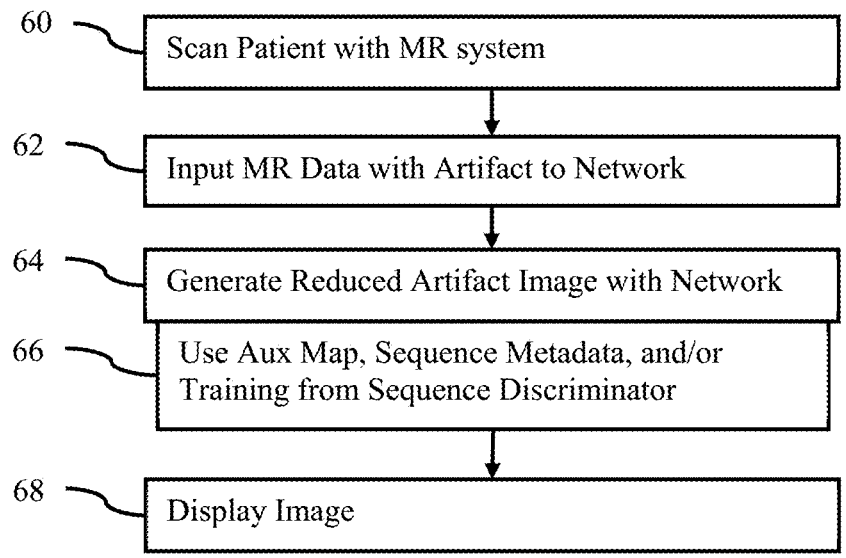
FIG. 6 is a flow chart diagram of one embodiment of a method for artifact reduction by applying a machine-learned image-to-image network.

FIGS. 1 and 6 show methods of artifact reduction in MR imaging. FIG. 1 is directed to machine training of the image-to-image neural network for generating images with reduced artifact relative to artifact contribution to input MR data. FIG. 6 is directed to application of a machine-learned network. In both cases, a machine, such as an image processor of a medical imaging system, workstation, computer, or server, implements some or all the acts. The same or different machine is used for training and application. The system of FIG. 7 implements one or both methods in one embodiment, but other systems may be used.

A user may select the image files for application of the learnt network by the processor or select the images from which to learn features and train the network by a processor. Use of the machine allows processing large volumes (e.g., images of many pixels and/or many images) of information that may not be efficiently handled by humans, may be unrealistically handled by humans in the needed time frame, or may not even be possible by humans due to unknown relationships and/or timing. The machine may learn in a way different than a human to generate a reduced artifact MR image, improving diagnosis or treatment.

The methods are provided in the orders shown (e.g., top to bottom or numerical), but other orders may be provided. For FIG. 1, acts 10 and 12 may be performed in a reverse order or simultaneously. For FIG. 6, acts 60 and 62 may be performed in a reverse order or simultaneously.

Additional, different or fewer acts may be provided. For example, act 16 of FIG. 1 is not provided. As another example, acts 66 and/or 68 of FIG. 6 are not provided. In yet other examples, acts for capturing images, configuring systems, and/or acts using output information are provided.

FIG. 1 shows a method of training a neural network for artifact reduction in a magnetic resonance imaging system. The training is by an image processor, the imaging system (i.e., scanner), a workstation, a server, a computer, or other machine. The machine learning trains to predict a spatial distribution of anatomy from the input MR data. Machine learning learns to generate an artifact reduced MR image from MR data with content resulting from an artifact. Rather than generate an image with all the content from the artifact, the machine training teaches the network to generate an image of the patient's anatomy with less of the artifact. Detailed modeling of the physics resulting in the artifact is not needed.

In act 10, training data is obtained. MR data of a same type of object (e.g., heart) is obtained. The MR data is obtained by data transfer, capture, and/or loading from memory. Any number of sets of MR data of a same type of object is obtained, such as tens or hundreds of sets. The images are obtained with a same type of scanner, whether being from a same scanner or different scanners of the same type (e.g., using an MR scanner or scanners).

The MR data is k-space data or image data. Image data is MR data after Fourier transform into object space. The image data may be at any point after transform, so may be scalar values or may be formatted as RGB values for a display screen. The obtained images may be scan data to be used to generate an image on a display. The obtained images may be data being processed to generate an image, data formatted for display, or data that has been used to display. MR data may be data with no or some image processing.

In one embodiment, the sets of MR data are captured using MR scanners. For example, gradient coils, a whole-body coil, and/or local coils generate a pulse or scan sequence in a magnetic field created by a main magnet or coil. The whole-body coil or local coils receive signals responsive to the re-orientation of molecules shifted due to the scan sequence.

Different sets are associated with different types of scan sequences, such as gradient echo sequence (GRE), balanced steady state free precession (SSFP), or another. Different sets are associated with different sequence protocols (i.e., different settings for scanning or post-scan processing), such as repetition time (TR), echo time (TE), inversion time (TI), or others.

The MR data represent volumes. Three-dimensional datasets are obtained. As k-space data, information content may be provided that is responsive to a three-dimensional distribution of locations, but the data itself does not directly represent the locations prior to transform. After transform, the image data has values for different locations distributed in three dimensions (e.g., NxMxO where N, M, and O are integers greater than 1). In alternative embodiments, two-dimensional datasets representing or responsive to tissue in planes are obtained. In other embodiments, sequences of MR data responsive to the same tissue over time are acquired for training.

The MR data is used for training in act 14. The MR data may be used as received or may be pre-processed, such as Fourier transformed, segmented, filtered (e.g., noise removal), masked (e.g., removing background information), and/or having geometric features identified (e.g., boundaries, centerlines, and/or hydraulic diameters).

The training data includes a ground truth. In this case, the ground truth is the image to be generated with reduced artifact content. For training, MR data having content caused by or including artifact and a corresponding image generated from the MR data with reduced or removed artifact are used. The ground truth may be generated using any post-processing removal or reduction of the contribution of the artifact. The ground truth images have a level of artifact reduced relative to the artifact information of the MR data.

In one embodiment, the training data is acquired directly from MR scanners, solely from simulation, or from a combination of the two. For direct MR scanner data collection, multiple acquisitions are performed with and without artifact removal/reduction technique(s) for artifact-free and artifact-contaminated data, respectively. For pure simulation data, digital phantoms are used, and MR acquisitions are simulated with and without artifact sources. In another embodiment, a MR scanner acquires MR data with no or little artifacts. Artifacts are added to the data with various severities. Since the training session is part of the development and offline, complex signal and physical models may be used to closely assemble realistic artifacts under various conditions with no influence to online application performance. During the training stage (development and offline), in order to generate training data, more time and resources may be used. At the testing stage, when the network is deployed, there is no need to use the complex conventional models to generate artifact reduced images for the network.

In act 12, a machine learning network arrangement is defined. The definition is by configuration or programming of the learning. The number of layers or units, type of learning, and other characteristics of the network are controlled by the programmer or user. In other embodiments, one or more aspects (e.g., number of nodes, number of layers or units, or type of learning) are defined and selected by the machine during the learning. Any part of the network architecture is defined.

The machine learning network is defined as an image-to-image network. Any machine training architecture for outputting a spatial distribution from an input spatial distribution may be used. For example, U-net is used. A convolutional-to-transposed-convolutional network is used. One segment (i.e., encoder) of layers or units applies convolution to increase abstractness or compression. The most abstract feature values are then output to another segment (i.e., decoder). The other segment of layers or units then applies transposed-convolution to decrease abstractness or compression, resulting in outputting of a generative image with less artifact that would result from image generation from the artifacted data. The encoder (convolutional) and decoder (transposed-convolutional) network forms a "U" shape with one vertical being encoding, another vertical being decoding, and the connection between being passing features at a greatest level of compression or abstractness from the encoder to the decoder. Any now known or later developed U-net architectures may be used. Skip connections, such as passing features at other scales than the greatest compression, may be provided. Other fully convolutional networks may be used.

Figure 2:
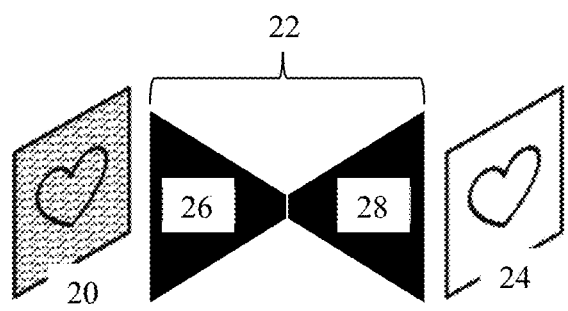
FIG. 2 illustrates one embodiment of an image-to-image network for artifact reduction in MR imaging.

FIG. 2 shows an example representation of an image-to-image network 22. The input MR data 20 is represented as an image (e.g., object space data of the heart). This MR data 20 is input to the encoder 26, which reduces scale, resolution, and/or number of features with increasing abstraction. The encoder 26 outputs to the decoder 28, which increases scale, resolution, and/or number of features with decreasing abstraction. The image-to-image network 22 as defined is to be trained to output an image 24 with reduced artifact (e.g., image of the heart without the repeating pattern artifact of the input image 20).

In one embodiment, the network arrangement is a neural network for deep learning. For example, a generative network or architecture formed by convolutional and/or deconvolutional layers is used. In one embodiment, a generative adversarial network is used. A discriminator receives images 24 output by the decoder 28 during training and learns to discriminate network generated images 24 from actual ground truth, reduced artifact images. The discriminator and image-to-image network 22 are trained together so that the image-to-image network 22 learns to generate images 24 that cannot be distinguished from the actual images by the discriminator. Other network arrangements may be used, such as a support vector machine.

Deep architectures include convolutional neural network (CNN) or deep belief nets (DBN), but other deep networks may be used. CNN learns feed-forward mapping functions while DBN learns a generative model of data. In addition, CNN uses shared weights for all local regions while DBN is a fully connected network (i.e., having different weights for all regions of an image). The training of CNN is entirely discriminative through back-propagation. DBN, on the other hand, employs the layer-wise unsupervised training (e.g., pre-training) followed by the discriminative refinement with back-propagation if necessary.

The network is defined as a plurality of sequential feature units or layers. Sequential is used to indicate the general flow of output feature values from one layer to input to a next layer. The information from the next layer is fed to a next layer, and so on until the final output. The layers may only feed forward or may be bi-directional, including some feedback to a previous layer. The nodes of each layer or unit may connect with all or only a sub-set of nodes of a previous and/or subsequent layer or unit. Skip connections may be used, such as a layer outputting to the sequentially next layer as well as other layers.

Rather than pre-programming the features and trying to relate the features to attributes, the deep architecture is defined to learn the features at different levels of abstraction based on an input image or k-space data with or without pre-processing. The features are learned to reconstruct lower level features (i.e., features at a more abstract or compressed level). For example, features for reconstructing an image are learned. For a next unit, features for reconstructing the features of the previous unit are learned, providing more abstraction. Each node of the unit represents a feature. Different units are provided for learning different features.

Various units or layers may be used, such as convolutional, pooling (e.g., max-pooling), deconvolutional, fully connected, or other types of layers. Within a unit or layer, any number of nodes is provided. For example, 100 nodes are provided. Later or subsequent units may have more, fewer, or the same number of nodes. In general, for convolution, subsequent units have more abstraction. For example, the first unit provides features from the image, such as one node or feature being a line found in the image. The next unit combines lines, so that one of the nodes is a corner. The next unit may combine features (e.g., the corner and length of lines) from a previous unit so that the node provides a shape indication. For transposed-convolution to reconstruct, the level of abstraction reverses. Each unit or layer reduces the level of abstraction or compression.

The features of the nodes are learned by the machine using any building blocks. For example, auto-encoder (AE) or restricted Boltzmann machine (RBM) approaches are used. AE transforms data linearly, and then applies a non-linear rectification, like a sigmoid function. The objective function of AE is the expected mean square error between the input image and reconstructed images using the learned features. AE may be trained using stochastic gradient descent or other approach to learn, by the machine, the features leading to the best reconstruction. The objective function of RBM is an energy function. Exact computation of the likelihood term associated with RBM is intractable. Therefore, an approximate algorithm, such as contrastive-divergence based on k-step Gibb sampling or other, is used to train the RBM to reconstruct the image from features.

Training of AE or RBM is prone to over-fitting for high-dimensional input data. Sparsity or denoising techniques (e.g., sparse denoising AE (SDAE)) are employed to constrain the freedom of parameters and force learning of interesting structures within the data. Enforcing sparsity within hidden layers (i.e., only a small number of units in hidden layers are activated at one time) may also regularize the network.

As an example implementation for motion artifact reduction, an image-to-image network coupled with an adversarial network is defined for generating motion compensated images from motion-corrupted images. The generator or image-to-image network is a fully convolutional DenseU-Net. The generator includes an encoder (e.g., successive sets of layer blocks, and pooling blocks, coming down to a bottleneck) and a decoder that takes in the encoder's bottleneck to up sample across multiple convolution layers at multiple scales and generate a corrected image. The discriminator architecture is a patchGAN, but another generative adversarial network (GAN) may be used.

Figure 3:
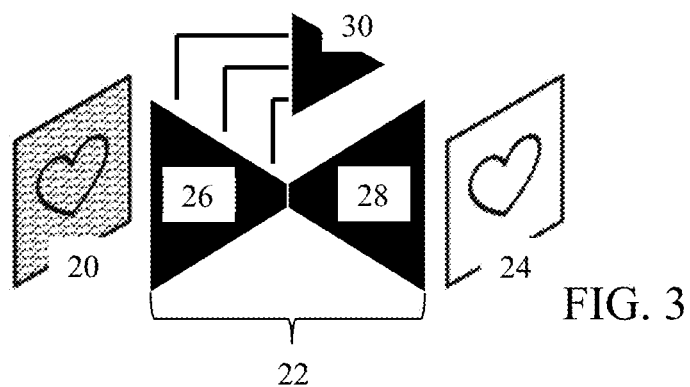
FIG. 3 illustrates one embodiment of an image-to-image network using a discriminator for training an encoder.
Figure 4:
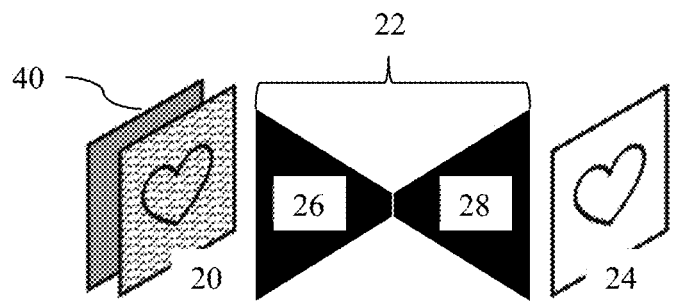
FIG. 4 illustrates one embodiment of an image-to-image network using input of an auxiliary map.
Figure 5:
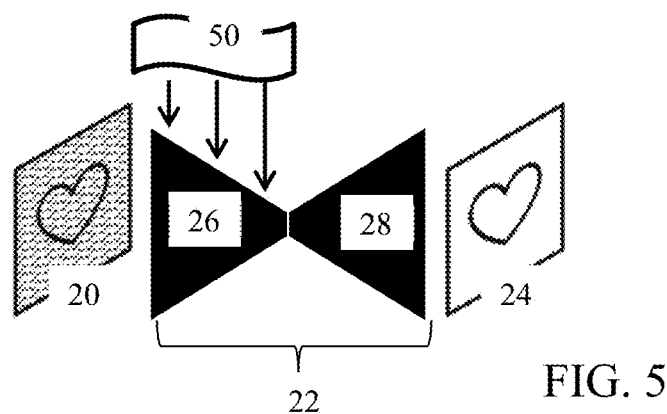
FIG. 5 illustrates one embodiment of an image-to-image network using scan sequence information in a controller of an encoder of the image-to-image network.

There are various MR scan sequences, including different types and/or protocols (e.g., settings). The image-to-image network is defined to allow one network to be trained to deal with multiple scan sequences. FIGS. 3-5 show three different examples of defining image-to-image networks to address scan sequence variation in the input MR data. Any of these three embodiments may be used alone or in combination of any two or all three of the embodiments. Alternatively or additionally, different image-to-image networks are created for different types of MR scanning.

FIG. 3 shows one embodiment of an image-to-image network defined to include a discriminator 30 connected with the encoder 26. The discriminator 30 is in addition to any discriminator at the output of the decoder 28. The discriminator 30 is any network or classifier, such as a neural network. The discriminator includes any number or arrangement of layers, units, nodes, or network architecture. The discriminator 30 is an adversarial network to be trained to distinguish between scan sequences.

The discriminator 30 is defined to receive features from one or more layers, units, or nodes of the encoder 26. For example, the discriminator 30 receives features from each pooling layer (e.g., max-pooling layer) of the encoder 26. No information is received from the decoder 28. In alternative embodiments, the discriminator 30 receives from fewer than all pooling or down sampling layers and/or receives from one or more layers of the decoder 28.

In one embodiment, the adversarial network provided by the discriminator 30 is defined to create contrast invariant features. Different scan sequences provide different levels of contrast. For example, T1 weighting provides different contrast than T2 weighting. In a brain imaging example, the white and grey matter of the brain respond differently to the T1 and T2 scan sequences, resulting in different contrast. Flair, DWI, or other scan sequences may similarly result in differences in contrast.

To train the same image-to-image network to operate for both types of scan sequences, the encoder 26 is to learn features that are contrast invariant. The discriminator 30 is to be trained to determine the scan sequence used based on features output by the encoder 26. Using this feedback, the encoder 26 may learn to use features that are contrast invariant (i.e., independent of the scan sequence) or have less contrast variance. This allows the image-to-image network to focus on the artifact rather than sequence-based variance. The image-to-image network, based on the defined discriminator 30, is arranged to focus on the actual artifact without any or with less regard to the contrast variation due to scan sequence The discriminator network 30 is defined to take the features from each pooling level and/or other layers of the encoder 26 and try to discriminate between the sequence (e.g., are those features from T1w, T2w, FLAIR, etc.). The adversarial loss is written such that the encoder 26 learns to generate features that could not be recognized by the sequence adaptation discriminator network 30.

FIG. 4 shows one embodiment of an image-to-image network defined to include an input channel for an auxiliary map 40. The image-to-image network 22 includes an initial layer for receiving the input MR data. This layer may include nodes for receiving the MR data and the auxiliary map 40. The nodes for receiving multiple values from a given source form an input channel to the image-to-image network 22. Different input channels are provided for the MR data for imaging the patient and the auxiliary map or maps. In alternative embodiments, the input channels for different types of data input to different layers, such as to provide for a parallel network structure at least at the input or to provide for input of one type of data to a layer receiving abstraction features from a layer to which the other type of data was input.

The auxiliary map 40 has data responsive to a distribution of locations. For example, the auxiliary map 40 is an image in object space or k-space data representing a plane or volume. In one embodiment, the auxiliary map is pre-scan data, such as k-space or image data from a pre-scan of the patient. In another embodiment, the auxiliary map is MR data from a coil correction pre-scan or other pre-scan performed for calibration of the MR scanner, such as a noise map or model generated by measuring without transmission of pulses. In yet another embodiment, the auxiliary map is segmented background. The air around the patient may be represented in the MR data. By segmenting this background, the background is input as an auxiliary map 40.

The auxiliary map 40 is different than the MR data used to generate the image of the patient. A subset of the MR data used to generate the patient may be used as the auxiliary map 40. MR data from a different scan (e.g., pre-scan) may be used as the auxiliary map 40. Non-MR data may be used, such as computed tomography (CT) information from a CT scan.

Artifacts may appear differently on different MR sequences, and different MR sequences may be prone to different artifacts. The auxiliary map 40 is defined as inputs to the network so that the image-to-image network 22 may use the map 40 as a guide for artifact removal. Images such as coil correction pre-scan or a noise map may be added as additional input channel(s) in the neural network to further the artifact removal. Separating the object of interest (i.e., patient) from the background may provide additional data from which the network is to learn. For instance, background is used to determinate the extent of motion artifact or the noise level in an image. The artifact appearance for background may assist in identifying or removing motion artifact in the image representing the patient.

FIG. 5 shows one embodiment of an image-to-image network 22 defined to include a controller 50. The controller 50 links to the encoder 26 for controlling the encoder 26 or one or more layers of the encoder 26 (e.g., at any scale). In one embodiment, the controller 50 links to the bottleneck (i.e., lowest scale, most abstract, and/or output of the encoder 26). Links to the decoder 28 may be provided. The controller 50 operates to alter features and/or control generation of features output by a layer or layers. Alternatively, the controller 50 provides data as an additional input to one or more layers.

The controller 50 uses scan sequence metadata. Scan sequence metadata includes the type of scan sequence, scan sequence protocol, a value or values of scan parameters, or other information. For example, any of the scan sequence information available as a header in a DICOM or other set of MR data is used as the metadata. The metadata is not an image (i.e., not in an image format).

This metadata is input to the encoder 26 for the encoder 26 to tune parameters of the encoder 26. The encoder 26 is defined to receive the scan sequence metadata as the controller 50. The controller 50 passes the metadata to the encoder 26 or processes the metadata and passes the results to the encoder 26. The controller 50 may be a neural network.

In one embodiment, the scan sequence metadata is used as controllers to remove or reduce artifacts. The sequence types (T1w, T2w, Flair, DWI) may be entered in a conditional matrix. Alternatively, parameters that characterize each sequence may be set as a conditional matrix. The conditional matrix concatenates with the bottleneck of the encoder 26. The generator would then decode a corrected image using the sequence information. Alternatively or additionally, the controller links to the decoder or the decoder and encoder, such as including one or more input channels in the decoder.

In act 14 of FIG. 1, a machine (e.g., image processor, workstation, computer, or server) performs machine training. The image-to-image network is trained to generate a patient image in application based on having learned from the training data (e.g., input sample sets, the ground truth images, and any other information such as metadata, auxiliary maps, or feedback from one or more discriminators). For example, the training uses the discriminator 30 to train the encoder 26 to generate contrast invariant features.

Machine learning is performed to train the various units using the defined architecture. The features (e.g., convolution kernels, transposed-convolution kernels, and max pooling connections) that are determinative or map to the ground truth are learned. The features providing the desired artifact reduced images are learned. The learning may use feedback from the decimator 30, input from auxiliary maps 40 for the different samples in the training data, and/or metadata input through the controller 50.

The results relative to the ground truth and the error for reconstruction for the network are back-projected to learn the features that work best. In one embodiment, a L2-norm loss is used to optimize the network. Other error functions may be used. In one embodiment, the weights of the network are randomly initialized, but another initialization may be used. End-to-end training, such as of the encoder and decoder with any discriminator, is performed, but one or more features may be set. Batch normalization, dropout, and data augmentation are not used, but may be. The optimization is with the RMSprop optimizer, but other optimization functions (e.g., Adam, SGD, etc.) may be used. During the optimization, the different distinguishing features are learned. The features providing an indication of an image with no or little artifact given input MR data contaminated by artifact are learned.

The training is to learn to output an image. The many samples in the training data are used to learn to output artifact reduced images given artifact contaminated MR data. The output image is for spatially distributed locations, such as outputting scalar or display values for 2D or 3D locations. Once trained, the image-to-image network may be applied to generate an image with less artifact than would be provided by imaging from the input MR data. In other embodiments, the training continues. The network is periodically updated. For example, online or other updated learning is performed. As new samples are acquired, the learning is repeated in total or to incorporate the further training data.

In act 16, the machine outputs a trained network. The machine-learned network is an image-to-image network incorporating the deep learned features for the various units and/or layers of the network and/or the relationships of input features to the output. The collection of individual features forms a feature or feature set for generating an artifact reduced image from MR data. For a convolutional neural network, the features are provided as nodes of the feature units in different levels of abstraction or compression. The nodes define convolution kernels trained to extract the features.

Once trained, a matrix, kernels, or other trained network is output. The machine-learned network includes definitions of convolution kernels, links, weights, pooling, and/or other characteristics of the network trained to generate the image from input MR data with or without input metadata and/or auxiliary map. The machine-learned detector is output to a network or memory. For example, the neural network as trained is stored in a memory for transfer and/or later application.

Once the network is trained, the network may be applied. The network with defined or learnt features is used to extract from previously unseen input MR data with or without other inputs (e.g., auxiliary map and/or metadata). The machine-learned network uses extracted features from the MR data with or without other information to generate an image. Motion and/or other artifacts may be reduced using the trained network.

FIG. 6 is a flow chart diagram of one embodiment for artifact reduction in a magnetic resonance imaging system. The machine-learned network is applied to generate an image with reduced artifact content from MR data.

Figure 7:
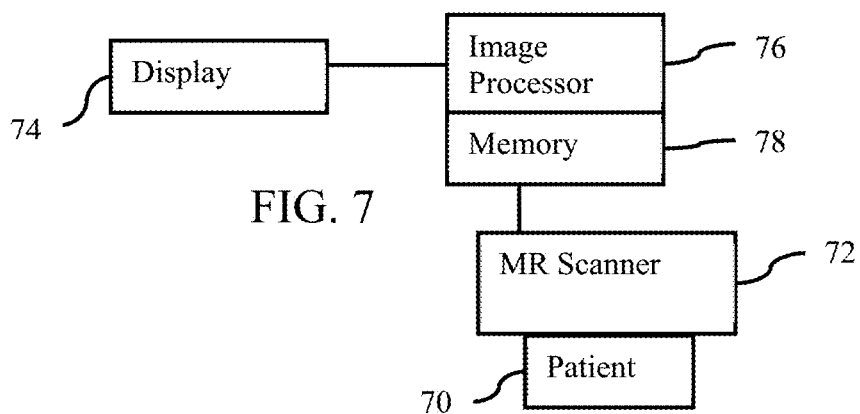
FIG. 7 is a block diagram of one embodiment of a MR system for artifact reduction.

The same image processor or a different image processor than used for training applies the learnt features and/or network. For example, the network architecture, learnt weights, and learnt kernels are transmitted from a graphics processing unit used to train to a medical MR scanner, medical server, or medical workstation. An image processor of the medical MR scanner applies the machine-learned network. For example, the medical imaging system of FIG. 7 is used. In one embodiment, the medical scanner or a work station at a same facility as the medical scanner applies the machine-learned network. In another embodiment, a server remote from the medical scanner and/or remote from a facility with the medical scanner applies the machine-learned network, such as generating the MR image as a service based on input of MR data from a client.

In act 60, the image processor receives MR data. The MR data is from a scan of a patient. For example, an MR imaging system scans the heart of a patient (e.g., torso, cardiac or heart scan). The resulting scan data is received from or by the MR system. The receipt is by scanning the patient using a scan sequence. The type and/or protocol of the sequence define settings for various parameters for scanning and/or generating an image from the scan. Alternatively, the receipt of the MR data is by receiving from a network interface. In other embodiments, receipt is by loading from memory.

The MR data is k-space data measured by the coils of the MR scanner or image data created by applying a Fourier transform to the k-space data. The MR data from a single scan or representing the patient for a given time or period (e.g., to create a single image) is a set of data. This set of data may be frame of data.

The scan is a 2D or 3D scan. For example, a set of MR data is acquired as an image representing or k-space data responsive to a planar region of the patient or a volume of the patient (e.g., multiple stacked planes or slices). The response from two or three spatial dimensions is detected by scanning.

The received medical image may be pre-processed, such as normalized, filtered, noise removed, masked, geometric features identified, and/or segmented in a same way as the training medical images. The received MR data is to be used to generate an image with reduced artifact from MR data.

In one embodiment, the scanning provides different sets of MR data. Each set represents response to scanning distributions of locations. For example, a coil, noise, or navigation pre-scan may scan the same locations as a scan to image a patient for diagnosis. As another example, different distributions of locations are represented, such as one set being for background locations and another set being for patient or patient and background locations.

One set of data is for an auxiliary map. The auxiliary map may be from a pre-scan, such as a navigation scan, noise mapping, and/or a coil correction. Calibration or other pre-scans may be used. The auxiliary map may be from a same scan as used to image the patient. For example, the MR data is segmented to identify the MR data representing a background region. The set of data for the background is the auxiliary map.

The other set of data is for patient diagnosis, prognosis, and/or treatment. The MR data for representing the patient in imaging and including contribution from the artifact is acquired. The MR data may be acquired using calibration, noise, alignment, or other information based on a pre-scan used for the auxiliary map. This pre-scan information is used to scan the patient for imaging. This imaging scan provides the other set of MR data. This set of MR data may include contribution or contamination of an unwanted artifact, such as motion artifact.

In act 62, MR data is input to the image-to-image network. The image processor receives, looks-up, accesses, or obtains the set or sets of MR data. The MR data is input to the neural network machine-trained as an image-to-image network. The MR data is for the input channel or channels of the network.

The set or sets input are k-space data or image data (i.e., data reconstructed into an object space by Fourier transform). One of the sets of data includes contribution from one or more artifacts. For example, patient motion causes a misalignment of data so that the spatial aspect of the k-space data is off. The Fourier transform then causes an artifact pattern in the image space.

The image-to-image network was trained from training data including artifacts and ground truth images with reduced or no contribution from the artifacts. The network was trained to generate an artifact reduced or free MR image based on the input set or sets of MR data.

In one embodiment, multiple sets of data are input. One set is the MR data from scanning a patient for imaging. The scan results in data used to represent the patient rather than being a pre-scan for calibration. The other set is an auxiliary map. The auxiliary map is MR data from a pre-scan, MR data representing a background from an imaging scan, a noise map or model, MR data from coil calibration, or other MR or non-MR data responsive to a spatial distribution of locations. In one embodiment, the same spatial extent (e.g., volume or collection of locations) with or without a same resolution is represented by the auxiliary map and the MR data for imaging. In other embodiments, different spatial extents are provided for the different sets of data.

The image processor inputs the imaging set of MR data and the auxiliary map to a same layer or to different layers of the image-to-image network. The same or different resolutions are used. Separate input channels of the image-to-image network receive the imaging set and the auxiliary map.

In another embodiment, the image processor inputs information about the scan sequence to the encoder and/or decoder of the image-to-image network. Sequence metadata, such as data from a header of the imaging set of MR data, is input. The sequence type, sequence protocol, and/or one or more settings for the scan sequence are input. The settings for the scan sequence may be for pulse design, measurement of response, and/or image generation from measured response. One or more values of imaging parameters characterizing the scan sequence are input.

The input is as a conditional matrix. The information for or defining the scan sequence is used with a controller to alter operation of the encoder. The features output by one or more layers and/or operation of the layers is tuned by the controller using the conditional matrix. In alternative embodiments, the information for the scan sequence is input on input channels of the network where the network derives features from the input channel.

In another embodiment, the image-to-image network was trained using a discriminator of scan sequences. One or more features at any level or levels of abstraction or scale were trained to be contrast invariant by the discriminator. In addition to any discriminator receiving the generated image from the decoder, a discriminator receives features from an intermediary portion of the image-to-image network to train the network to be less sensitive to different scan sequences.

In act 64, the image processor generates an image. In response to inputting the set or sets with or without other information to the image-to-image neural network, the network generates an image as an output. The artifact level in the generated image is reduced relative to the contribution from the artifact in the MR data. The generated image has less artifact content than would be provided by reconstruction or imaging from the MR data to generate the image without artifact reduction. The level of artifact may be the same, less, or more than if post-processing for artifact reduction is applied to an image provided by MR imaging, but the use of the network allows the image processor to more rapidly and/or with greater computational efficiency generate the image than with post-processing for artifact reduction. The use of the auxiliary map (in application), scan sequence information (in application), and/or discriminator for the encoder (in training) in act 68 results in an image-to-image network operable over a wider range of artifacts and/or imaging situations than is typical with post-processing for artifact reduction.

The image processor, using the image-to-image network, generates the image as scalar or display values (e.g., RGB) values for locations distributed in two or three dimensions. For example, a MR-based tissue or anatomy image or k-space data is input, and a MR-based image is output. Any inputs for which the network is trained to use are applied as an input feature vector and/or controller, such as an auxiliary map as an input feature vector and/or scan information as a controller or conditional matrix. In some embodiments, a sequence of images is input, such as MR data acquired at different times throughout a cardiac or breathing cycle (e.g., 10-20 frames of data over one or more heart cycles), and one or more images are generated, such as images representing a sequence or the patient at different times.

In act 68, the image processor, using a display, causes display of the generated image. After any further image processing (e.g., color mapping), the image is output to a display, into a patient medical record, via a computer network, and/or to a report. The image is displayed.

FIG. 7 shows a medical imaging system for reduced artifact MR image generation. An image-to-image network is trained and/or applied to receive MR data as input and output an image with at least some of the contribution from artifact in the MR data removed. To deal with a variety of different scan sequences reflected in the MR data, the image-to-image network may be trained with a discriminator for the encoder to make features more contrast invariant, may use scan sequence information in a controller, and/or may receive auxiliary map information as an input.

The medical imaging system includes the display 74, memory 78, and image processor 76. The display 74, image processor 76, and memory 78 may be part of the MR scanner 72, a computer, server, or other system for image processing medical images from a scan of a patient. A workstation or computer without the MR scanner 72 may be used as the medical imaging system. Additional, different, or fewer components may be provided, such as including a computer network for remote image generation of locally captured scans or for local image generation from remotely captured scans. The network is applied as a standalone application on the workstation or a local device or as a service deployed on network (cloud) architecture.

The medical imaging system is for training, such as using images or k-space data from the memory 78 and/or MR scanner 72 as input samples and corresponding ground truth. Alternatively, the medical imaging system is for application of the machine-learned network as trained.

The MR scanner 72 is a medical diagnostic imaging system configured to scan a volume of a patient and generate anatomical information from the scan. In one embodiment for application of the machine-learned network, a main magnet or coil generates a substantially uniform magnetic field through the patient 70. Gradient coils, local coils, and/or a whole-body coil generate a pulse sequence to shift spin axes of molecules in the patient away from the uniform magnetic field lines. The local coils and/or whole-body coil detect radio frequency emissions caused by the relaxation of the spin axes of the molecules returning to the magnetic field lines. This k-space data is reconstructed into an object or spatial domain using Fourier processing or used as the input MR data. After transform, the scan or image data represents tissue response from a region of the patient 70 and may be input as the MR data. The pulse sequence may be repeated or continues to obtain scan data representing the region over time. Any MR imaging pulse sequence or scanning may be used.

The image processor 76 is a control processor, general processor, digital signal processor, three-dimensional data processor, graphics processing unit, application specific integrated circuit, field programmable gate array, digital circuit, analog circuit, combinations thereof, or other now known or later developed device for processing medical image data. The image processor 76 is a single device, a plurality of devices, or a network. For more than one device, parallel or sequential division of processing may be used. Different devices making up the image processor 76 may perform different functions. In one embodiment, the image processor 76 is a control processor or other processor of a medical diagnostic imaging system, such as the MR scanner 72. The image processor 76 operates pursuant to stored instructions, hardware, and/or firmware to perform various acts described herein, such as controlling scanning, preprocessing MR data, obtaining an auxiliary map and/or scan sequence information, and/or generating an output image with reduced artifact.

The image processor 76 is configured to train a machine learning architecture. Based on a user provided or other source of the network architecture and training data, the image processor 76 learns features for an encoder and a decoder or other network parts to train the network. More than one discriminator may be used in training, such as one for discriminating between network generated images and actual images and another for discriminating between features from different scan sequences. The result of the training is a machine-learned network for generating an MR image from input MR data.

Alternatively or additionally, the image processor 76 is configured to apply one or more machine-learned networks. An image-to-image network is applied to convert artifacted MR data into an MR image. Scan sequences may be accounted for by input of other information. For example, scan sequence information is used to control or tune features of the encoder. In another example, an auxiliary map is input with the MR data. The machine-learned generative network is applied to MR data with or without scan sequence information and/or an auxiliary map. Based on the previous training, the network generates an MR image in response to application of the inputs.

The image processor 76 may be configured to output an image showing spatial distribution of the tissue or patient. A sequence of images showing the spatial distribution of the flow over time may be output. In other embodiments, the spatial distribution is used to calculate a value for a quantification. The value is output in an image.

The display 74 is a CRT, LCD, projector, plasma, printer, tablet, smart phone or other now known or later developed display device for displaying the output, such as the MR image. The display 74 displays a medical image for diagnosis, prognosis, and/or treatment. Due to reduced artifact, the MR image provides more accurate information to the physician, allowing for more reliable diagnosis, prognosis, and/or treatment.

The instructions, training data, network definition, features, machine-learned network, outputs, and/or other information are stored in a non-transitory computer readable memory, such as the memory 78. The memory 78 is an external storage device, RAM, ROM, database, and/or a local memory (e.g., solid state drive or hard drive). The same or different non-transitory computer readable media may be used for the instructions and other data. The memory 78 may be implemented using a database management system (DBMS) and residing on a memory, such as a hard disk, RAM, or removable media. Alternatively, the memory 78 is internal to the processor 76 (e.g. cache).

The instructions for implementing the training or application processes, methods, and/or techniques discussed herein are provided on non-transitory computer-readable storage media or memories, such as a cache, buffer, RAM, removable media, hard drive or other computer readable storage media (e.g., the memory 78). Computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone or in combination.

In one embodiment, the instructions are stored on a removable media device for reading by local or remote systems. In other embodiments, the instructions are stored in a remote location for transfer through a computer network. In yet other embodiments, the instructions are stored within a given computer, CPU, GPU or system. Because some of the constituent system components and method steps depicted in the accompanying figures may be implemented in software, the actual connections between the system components (or the process steps) may differ depending upon the manner in which the present embodiments are programmed.

Various improvements described herein may be used together or separately. Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention.

What is claimed is:

1. A method for artifact reduction in a magnetic resonance imaging system, the method comprising:
   scanning a patient by the magnetic resonance imaging system, the scanning providing at least first and second sets of magnetic resonance data, the first and second sets representing response to the scanning from first and second distributions of locations;
   inputting the first and second sets of the magnetic resonance data to a neural network machine trained as an image-to-image network;
   generating an image by the neural network in response to the inputting of the first and second sets; and
   displaying the image,
   wherein inputting comprises inputting the second set as k-space data or as image data reconstructed from the k-space data, the second set including artifact information, and wherein the neural network was trained from third sets including artifacts and ground truth images with a reduced contribution from the artifacts.

2. The method of claim 1 wherein scanning comprises acquiring the first set with a pre-scan of the patient and acquiring the second set as an imaging scan of the patient based on the pre-scan.

3. The method of claim 2 wherein acquiring the first set comprises acquiring a coil correction pre-scan or a noise map.

4. The method of claim 1 wherein scanning comprises scanning the patient and a background region around the patient, the first set being for the background region and the second set being for the patient.

5. The method of claim 1 wherein inputting comprises inputting the first and second sets on separate input channels of the neural network, wherein the first and second distributions of locations comprise either a same location or two different locations.

6. The method of claim 1 wherein the first set comprises an auxiliary map, and the second set comprises the magnetic resonance data for representing the patient in imaging and including contribution from the artifact, and wherein generating the image comprises generating the image with an artifact level reduced relative to the contribution from the artifact.

7. The method of claim 1 wherein scanning comprises scanning with a scan sequence, and wherein inputting comprises inputting information about the scan sequence to an encoder of the image-to-image network.

8. The method of claim 1 wherein scanning comprises scanning with a scan sequence, and wherein the image-to-image network includes an encoder having been trained with a discriminator of scan sequences.

9. A method for artifact reduction in a magnetic resonance imaging system, the method comprising:
   scanning a patient by the magnetic resonance imaging system, the scanning providing a set of magnetic resonance data based on a scan sequence;
   inputting the set of the magnetic resonance data to a neural network machine trained as an image-to-image network;
   inputting information about the scan sequence to an encoder or decoder of the image-to-image network;
   generating an image of the patient by the neural network in response to the inputting of the set and the information; and
   displaying the image,
   wherein inputting the information comprises inputting parameters characterizing the sequence as a conditional matrix configured to tune features of the encoder.

10. The method of claim 9 wherein inputting the set comprises inputting the set as k-space data or as image data reconstructed from the k-space data, the set including artifact information, and wherein the neural network was trained from training sets of magnetic resonance data including artifacts and ground truth images with a reduced contribution from the artifacts.

11. The method of claim 9 wherein inputting the information comprises inputting sequence metadata.

12. The method of claim 11 wherein inputting the sequence metadata comprises inputting a sequence type and/or sequence protocol values.

13. The method of claim 9 wherein inputting the information comprises inputting the information in a conditional matrix.

14. The method of claim 9 wherein the magnetic resonance data includes contribution from the artifact, and wherein generating the image comprises generating the image with an artifact level reduced relative to the contribution from the artifact.

15. The method of claim 9 wherein inputting the set comprises inputting the set and an auxiliary map on separate input channels of the encoder or decoder.

16. The method of claim 9 wherein the image-to-image network includes the encoder having been trained with a discriminator of scan sequences.

* * * * *